(12) United States Patent
Stone et al.

(10) Patent No.: US 8,672,311 B2
(45) Date of Patent: Mar. 18, 2014

(54) METHOD OF COOLING TEXTURED WORKPIECES WITH AN ELECTROSTATIC CHUCK

(75) Inventors: Dale K. Stone, Lynnfield, MA (US); Julian G. Blake, Gloucester, MA (US); D. Jeffrey Lischer, Acton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 578 days.

(21) Appl. No.: 12/791,278

(22) Filed: Jun. 1, 2010

(65) Prior Publication Data

US 2011/0291344 A1    Dec. 1, 2011

(51) Int. Cl.
    *B23Q 3/00* (2006.01)

(52) U.S. Cl.
    USPC ........................................ 269/289 R; 269/21

(58) Field of Classification Search
    USPC ............ 269/21, 903, 900, 289 R, 20, 49, 266
    See application file for complete search history.

(56) References Cited

U.S. PATENT DOCUMENTS

| | | | |
|---|---|---|---|
| 4,502,094 A * | 2/1985 | Lewin et al. | 361/234 |
| 6,241,825 B1 * | 6/2001 | Wytman | 118/733 |
| 7,075,772 B2 * | 7/2006 | Heiland | 361/234 |
| 7,669,839 B2 * | 3/2010 | McClaran | 269/21 |
| 2002/0141134 A1 | 10/2002 | Frutiger | |
| 2004/0020789 A1 * | 2/2004 | Hu et al. | 205/666 |
| 2009/0250855 A1 * | 10/2009 | Fujii et al. | 361/234 |

* cited by examiner

*Primary Examiner* — Monica Carter
*Assistant Examiner* — Melanie Alexander

(57) ABSTRACT

A workpiece support, which more effectively cools a textured workpiece is disclosed. A layer is added on top of a workpiece support. This layer is sufficiently soft so as to conform to the textured workpiece. Furthermore, the layer has a dielectric constant such that it does not alter the normal operation of the underlying electrostatic clamp. In some embodiments, the locations of the ground and lift pins are moved to further reduce the leakage of backside gas.

13 Claims, 6 Drawing Sheets

US 8,672,311 B2

METHOD OF COOLING TEXTURED WORKPIECES WITH AN ELECTROSTATIC CHUCK

FIELD

This disclosure relates to workpiece cooling, and more particularly to an apparatus and a method of cooling a textured workpiece.

BACKGROUND

An electronic device may be created from a workpieces that has undergone various processes. One of these processes may include introducing impurities or dopants to alter the electrical properties of the original workpiece. For example, charged ions, as impurities or dopants, may be introduced to a workpiece, such as a silicon wafer, to alter electrical properties of the workpiece. One process that introduces impurities to the workpiece may be an ion implantation process.

An ion implanter is used to perform ion implantation or other modifications of a workpiece. A block diagram of a conventional ion implanter is shown in FIG. 1. Of course, many different ion implanters may be used. The conventional ion implanter may comprise an ion source 102 that may be biased by a power supply 101. The system may be controlled by controller 120. The operator communicates with the controller 120 via user interface system 122. The ion source 102 is typically contained in a vacuum chamber known as a source housing (not shown). The ion implanter system 100 may also comprise a series of beam-line components through which ions 10 pass. The series of beam-line components may include, for example, extraction electrodes 104, a 90° magnet analyzer 106, a first deceleration (D1) stage 108, a 70° magnet collimator 110, and a second deceleration (D2) stage 112. Much like a series of optical lenses that manipulate a light beam, the beam-line components can manipulate and focus the ion beam 10 before steering it towards a workpiece or wafer 114, which is disposed on a workpiece support 116.

In operation, a workpiece handling robot (not shown) disposes the workpiece 114 on the workpiece support 116 that can be moved in one or more dimensions (e.g., translate, rotate, and tilt) by an apparatus, sometimes referred to as a "roplat" (not shown). Meanwhile, ions are generated in the ion source 102 and extracted by the extraction electrodes 104. The extracted ions 10 travel in a beam-like state along the beam-line components and implanted on the workpiece 114. After implanting ions is completed, the workpiece handling robot may remove the workpiece 114 from the workpiece support 116 and from the ion implanter 100.

Referring to FIGS. 2A and 2B, there is shown a block diagram illustrating the workpiece support 116 supporting the workpiece 114 during the ion implantation process. As illustrated in FIG. 2A, the workpiece support 116 may comprise a top layer 210 that is in contact with the workpiece 114. In addition, the workpiece support 116 may also include at least one cooling region 206. During the implantation process, cooling gas may be provided to the cooling region 206 prevent the workpiece 114 from overheating. The workpiece support 116 may have gas channels and conduits to allow this cooling gas to flow to the cooling region 206. The workpiece support 116 may further include a plurality of lift pins 208 that may move so as to push the workpiece 114 away from the workpiece support 116 in the direction indicated by the arrows. The lift pins 208 may be retracted within the workpiece support 116, as illustrated in FIG. 2B.

The workpiece support 116 may be cylindrical in shape, such that its top surface is circular, so as to hold a disc-shaped workpiece. Of course, other shapes, such as squares, are possible. To effectively hold the workpiece 114 in place, most workpiece supports typically use electrostatic force. By creating a strong electrostatic force on the upper side of the workpiece support 116, the support can serve as the electrostatic clamp or chuck, the workpiece 114 can be held in place without any mechanical fastening devices. This minimizes contamination, avoids wafer damage from mechanical clamping and also improves cycle time, since the workpiece does not need to be unfastened after it has been implanted. These clamps typically use one of two types of force to hold the substrate in place: coulombic or Johnsen-Rahbek force.

As seen in FIG. 2A, the workpiece support 116 traditionally consists of several layers. The first, or top, layer 210, which contacts the workpiece 114, is made of an electrically insulating or semiconducting material, such as alumina, since it must produce the electrostatic field without creating a short circuit. In some embodiments, this top layer 210 is about 4 mils thick. For those embodiments using coulombic force, the resistivity of the top layer 210, which is typically formed using crystalline and amorphous dielectric materials, is typically greater than $10^{14}$ Ω-cm. For those embodiments utilizing Johnsen-Rahbek force, the volume resistivity of the top layer 210, which is formed from a semiconducting material, is typically in the range of $10^{10}$ to $10^{12}$ Ω-cm. The term "non-conductive" is used to describe materials in either of these ranges, and suitable for creating either type of force. The coulombic force can be generated by an alternating voltage (AC) or by a constant voltage (DC) supply.

Directly below this layer is a conductive layer 212, which contains the electrodes that create the electrostatic field. This conductive layer 212 is made using electrically conductive materials, such as silver. Patterns are created in this layer, much like are done in a printed circuit board to create the desired electrode shapes and sizes. Below this conductive layer 212 is a second insulating layer 214, which is used to separate the conductive layer 212 from the lower portion 220.

The lower portion 220 is preferably made from metal or metal alloy with high thermal conductivity to maintain the overall temperature of the workpiece support 116 within an acceptable range. In many applications, aluminum is used for this lower portion 220.

Initially, the lift pins 208 are in a lowered position. The workpiece handling robot 250 then moves a workpiece 114 to a position above the workpiece support 116. The lift pins 208 may then be actuated to an elevated position (as shown in FIG. 2A) and may receive the workpiece 114 from the workpiece handling robot 250. Thereafter, the workpiece handling robot 250 moves away from the workpiece support 116 and the lift pins 208 may recede into the workpiece support 116 such that the top layer 210 may be in contact with the workpiece 114, as shown in FIG. 2B. The implantation process may then be performed with the lift pins 208 in this recessed position. After the implantation process, the workpiece 114 is unclamped from the workpiece support 116, having been held in place by electrostatic force. The lift pins 208 may then be extended into the elevated position, thereby elevating the workpiece 114 and separating the workpiece 114 from the top layer 210 of the workpiece support 116, as shown in FIG. 2A. The workpiece handling robot 250 may then be disposed under the workpiece 114, where it can retrieve the implanted workpiece 114 at the elevated position. The lift pins 208 may then be lowered, and the robot 250 may then be actuated so as to remove the workpiece 114 from the implanter.

This technique is effective, especially when the workpiece 114 and the workpiece support 116 are both substantially planar. This allows the workpiece 114 and workpiece support 116 to couple together closely when clamped. This tight coupling serves to confine the cooling gas to the cooling regions 206.

However, in some embodiments, the workpiece may not be planar. For example, it is advantageous for the surface of a solar cell to be textured, to minimize reflection of photons and thus maximize cell efficiency. One common method to achieve this textured surface is to bathe the workpiece in acid or alkaline solutions. While such baths are less expensive than other processes, they will texture both sides, not just the surface exposed to the photons. However, since manufacturing costs are critical for the solar cell industry, this may be an accepted consequence. Also ion implantation into the rear surface of the cell is beneficial in producing a back surface field, so even were only the front of the cell textured it would still be necessary to clamp the textured surface for this application.

One consequence of textured workpiece surfaces is that the workpiece support 116 and the workpiece 114 no longer form a tight coupling as described earlier. FIG. 3 shows an exaggerated view of the interface between a textured workpiece 200 and a workpiece support 116. This interface presents several issues related to the cooling of the workpiece 200. First, the textured surface of workpiece 200 implies that a lower percentage of the surface of the workpiece 200 is in physical contact with the workpiece support 116. This reduces the ability of the workpiece support 116 to pull heat away from the workpiece 200 via conduction. A second issue is related to the cooling gas. The workpiece 116 may have cooling conduits 210, as shown in FIG. 3. Gas is injected into the area between the workpiece 200 and the workpiece support 116, as described above, through the cooling conduits 210. However, since there is less contact between the textured workpiece 200 and the workpiece support 116, the gas is not confined to cooling regions (as described in connection to FIG. 2A). As result, the gas escapes from the edges between the textured workpiece 200 and the workpiece support 116. This increases the pressure within the chamber, which is preferably held as close to vacuum as possible, and decreases the pressure between workpiece and clamp. This is detrimental to the ion implantation process, and is detrimental in cooling the workpiece 200. A third issue is the lower available electrostatic clamp force due to the higher average gap.

Accordingly, there is a need in the art for an improved workpiece support that can effectively cool textured workpieces.

SUMMARY

The problems of the prior art are overcome by the apparatus and method of this disclosure. A layer is added on top of a workpiece support. This layer is sufficiently soft so as to conform to the textured workpiece. Furthermore, the layer has a dielectric constant such that it does not alter the normal operation of the underlying electrostatic clamp. In some embodiments, the locations of the ground and lift pins are moved to further reduce the leakage of backside gas.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION

In the present disclosure, several embodiments of an apparatus and a method for cooling a textured workpiece are introduced. For purpose of clarity and simplicity, the present disclosure will focus on an apparatus and a method for cooling a textured workpiece that is processed by a beam-line ion implanter. Those skilled in the art, however, may recognize that the present disclosure is equally applicable to other types of processing systems including, for example, a plasma immersion ion implantation ("PIII") system, a plasma doping ("PLAD") system, other implantation systems, an etching system, an optical based processing system, and a chemical vapor deposition (CVD) system. As such, the present disclosure is not to be limited in scope by the specific embodiments described herein.

Figure 1:
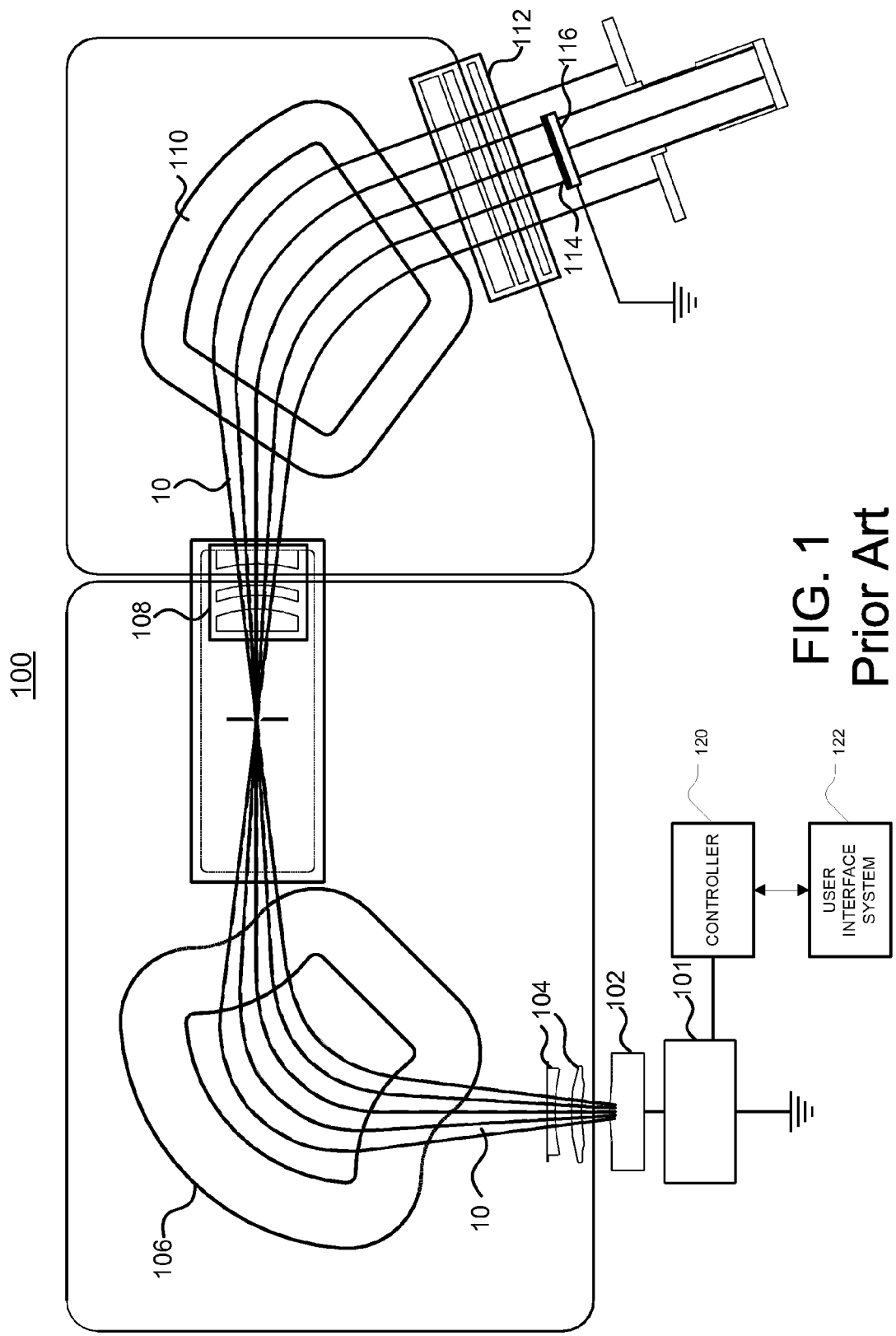
FIG. 1 represents a traditional ion implantation system.
Figure 2A:
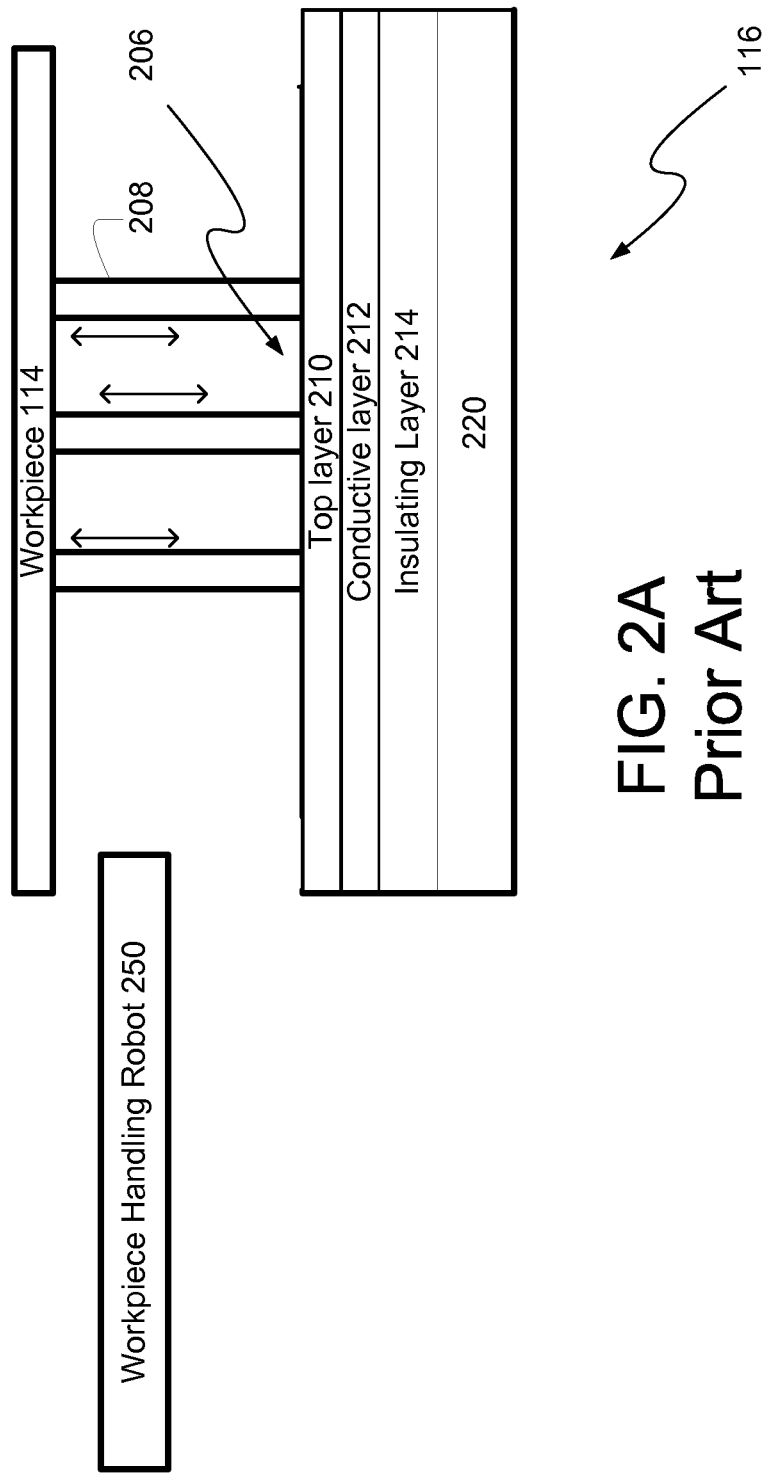
FIG. 2A represents a block diagram showing a workpiece support supporting a workpiece with the lift pins extended.
Figure 2B:
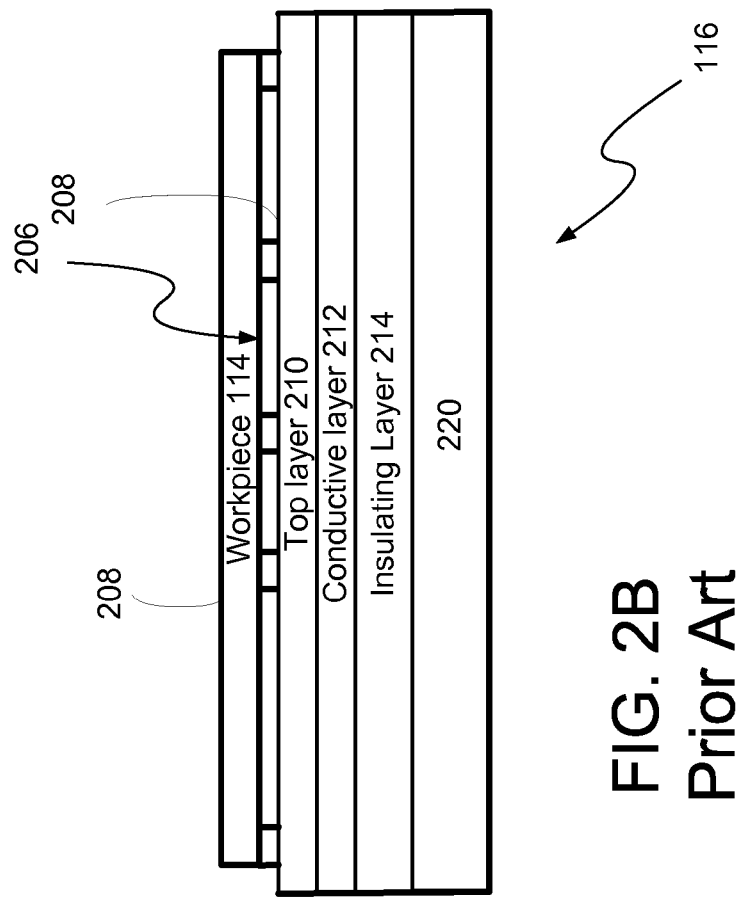
FIG. 2B represents a block diagram showing a workpiece support supporting a workpiece with the lift pins recessed.
Figure 3:
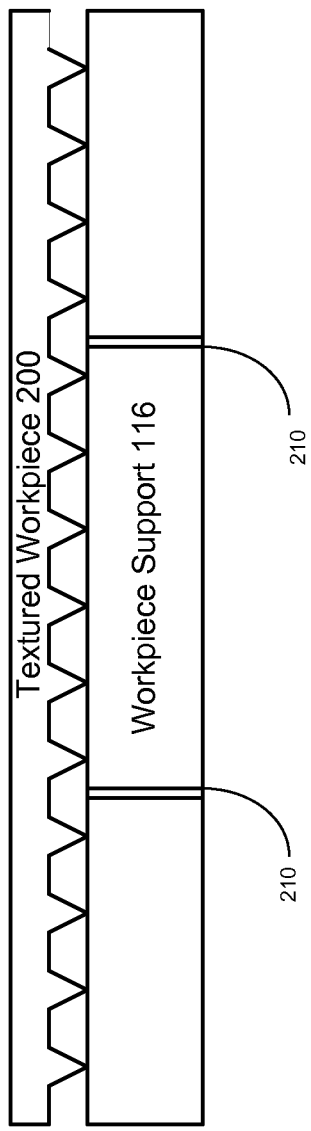
FIG. 3 represents an exaggerated view of the interface between a textured workpiece and a workpiece support in the prior art.
Figure 4:
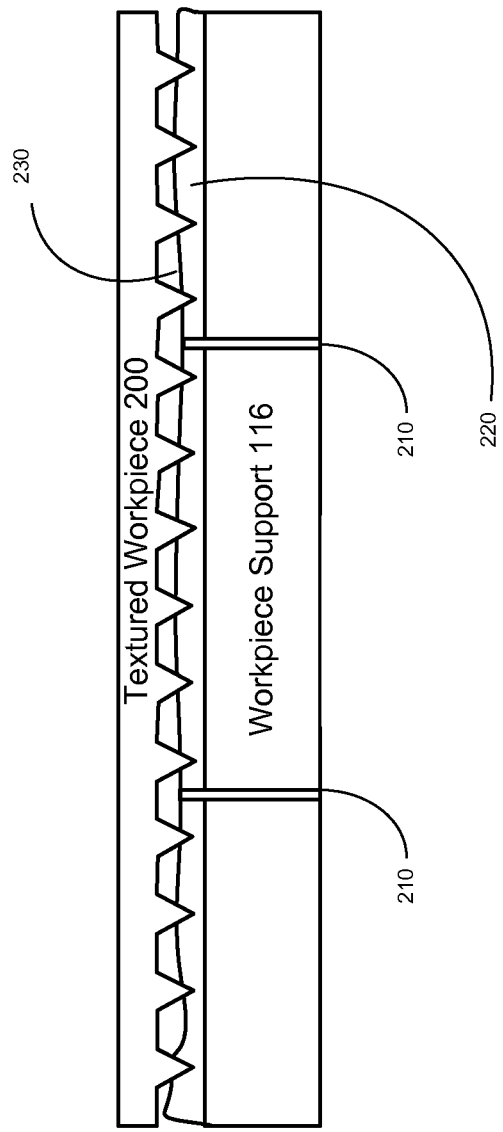
FIG. 4 represents an exaggerated view of the interface between a textured workpiece and a workpiece support according to one embodiment.

As described above in FIG. 3, a tight coupling may not be possible when a textured workpiece 200 is placed atop a conventional workpiece support 116. FIG. 4 shows a first embodiment, where a layer 220 is applied to the top surface of the workpiece support 116. The layer 220 is sufficiently soft so as to conform to the shape of the textured workpiece 200. Typically hardness is measured by durometer, and a Shore D scale of about 40 to 90 is appropriate. In addition, it is desirable that the dielectric constant of the layer is relatively low, but much greater than air. The dielectric constant of air is approximately 1 and the dielectric constant of typical electrostatic clamp hard dielectrics is 5 to 10. Desirable dielectric constants for the compliant dielectric are in the range of 2 to 5. Furthermore, the breakdown voltage of the material should be fairly high, so as to function properly when the electrostatic fields are applied. High quality $SiO_2$ has a breakdown voltage of 10E6 volts/cm, and the breakdown voltage of the dielectric is typically above 5E6/cm.

Materials satisfying these requirements are referred to as "compliant dielectrics", and include materials such as silicone rubber, polymers such as polyurethane, fluorocarbons like Teflon and certain epoxies.

The layer of compliant dielectric does not need to be thick to perform its intended function. In fact, the thickness of layer 220 can be between 10 μm and 50 μm. This layer 220 can be applied in several ways. For example, many compliant dielectrics are available as thin sheets and can be applied by bonding to the platen surface using some amount of heat. In another embodiment, the compliant dielectric is deposited on the workpiece support. In this embodiment, the dielectric is deposited from a vapor with a subsequent phase change, but without a chemical change from the precursor). In other embodiments, chemical vapor deposition (CVD) from a mixture of precursor gasses (with a chemical change as the film deposits onto the surface) is performed. In other embodiments, physical deposition, such as sputtering from a target made of the dielectric, is performed. For each of these deposition approaches, the apertures for lift and ground pins, and any gas distribution holes are typically masked to prevent deposition in these regions.

The ability of the layer 220 to conform to the shape of the textured workpiece 200 allows a tighter coupling between the textured workpiece 200 and the workpiece support 116. As stated above, this will improve heat transfer from the workpiece 200 to the workpiece support 116. Furthermore, this tighter coupling provides closed cooling regions 230 into which the gas can be injected via conduits 210 between the workpiece 200 and the workpiece support 116 (also known as backside gas). Because the layer 220 conforms to the shape of the textured workpiece 200, the backside gas does not escape from the edges between these components and remains within the closed cooling regions 230.

Figure 5:
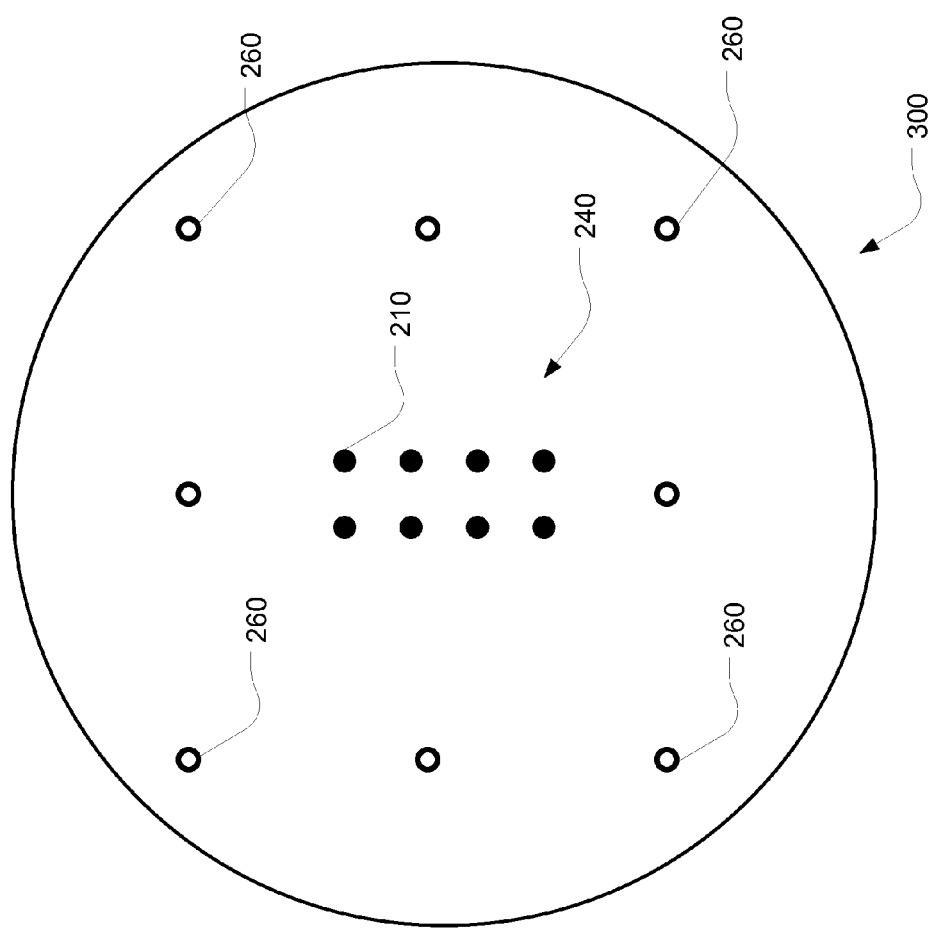
FIG. 5 is a top view of a workpiece support according to one embodiment.

In some embodiments, the locations of the gas conduits 210, relative to the lift pins and ground pins are also altered. Because the textured workpiece 200 may allow gas to escape from the edges, the gas conduits 210 are moved closer to the middle of the workpiece support. FIG. 5 shows a top view of a workpiece support 300, with gas conduits 210 located near the center of the support 300. This creates a gas distribution region 240 that is distanced from the edge of the workpiece support 300. Located outside of the gas distribution region 240 are the ground and lifting pins 260.

Note that in some embodiments, the compliant dielectric creates an adequate seal such that the gas distribution region 240 can be larger and include a greater portion of the workpiece. In further embodiments, the gas conduits 210 are located outside of the lifting and ground pins 260.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes.

What is claimed is:

1. A device for cooling a workpiece, comprising:
a workpiece support comprising a top layer, a second layer, and electrodes disposed between said top layer and said second layer, said electrodes configured to provide an electrostatic field, wherein said top layer has a top surface and said workpiece support further comprising lift pins, gas conduits, and ground pins; and
a layer of a dielectric material applied to said top surface of said workpiece support, said layer of dielectric material adapted to contact said workpiece and conform to a textured surface of a workpiece disposed on said layer of dielectric material.

2. The device of claim 1, wherein said dielectric material comprises silicone rubber, other polymers, fluorocarbons or epoxy.

3. The device of claim 1, wherein said gas conduits are in communication with said top surface and are located closer to a center of said workpiece support than said lift pins and said ground pins.

4. The device of claim 1, wherein said dielectric material has a dielectric constant between 2 and 5.

5. An apparatus suitable for ion implantation, comprising:
a workpiece to be implanted, said workpiece having a textured surface;
a workpiece support comprising a top layer, a second layer, and a conductive layer disposed between said top layer and said second layer, said conductive layer having a plurality of electrodes that provide an electrostatic field, and
a layer of dielectric material applied to a top surface of said top layer of said workpiece support and in contact with said textured surface of said workpiece, wherein said layer of dielectric material conforms to said textured surface.

6. The apparatus of claim 5, wherein said dielectric material comprises silicone rubber, other polymers, fluorocarbons or epoxy.

7. The apparatus of claim 5, wherein said workpiece support comprises lift pins, gas conduits and ground pins, and said gas conduits are in communication with said top surface and are located closer to a center of said workpiece support than said lift pins and said ground pins.

8. The device of claim 1, wherein said layer of dielectric material has a thickness between 10 µm and 50 µm.

9. The apparatus of claim 5, wherein said layer of dielectric material has a thickness between 10 µm and 50 µm.

10. The device of claim 1, wherein said layer of dielectric material has a hardness between 40 and 90 on a Shore D scale.

11. The apparatus of claim 5, wherein said layer of dielectric material has a hardness between 40 and 90 on a Shore D scale.

12. The apparatus of claim 5, wherein said dielectric material has a dielectric constant between 2 and 5.

13. The apparatus of claim 5, wherein a plurality of closed cooling regions are formed between said workpiece and said layer of dielectric material whereby a backside gas is contained at an edge between said layer of dielectric material and said workpiece.

* * * * *